United States Patent [19]
Hori et al.

[11] Patent Number: 5,084,744
[45] Date of Patent: Jan. 28, 1992

[54] FIELD EFFECT TRANSISTOR WITH ACTIVE LAYER APART FROM GUARD-RING

[75] Inventors: Yoshihiro Hori, Yokosuka; Keiichiro Doi, Yokohama; Manabu Endo, Yokohama; Toshiki Yoshida, Yokohama, all of Japan

[73] Assignee: Victor Company of Japan, Ltd., Japan

[21] Appl. No.: 169,036

[22] Filed: Mar. 16, 1988

[30] Foreign Application Priority Data

Mar. 20, 1987 [JP] Japan ................................ 62-66541

[51] Int. Cl.$^5$ .............................................. H01L 29/80
[52] U.S. Cl. ........................................ 357/22; 357/41; 357/47; 357/52
[58] Field of Search ...................... 357/22, 22 A, 22 C, 357/22 D, 22 M, 22 S, 22 G, 22 I, 22 MO, 22 LA, 22 GR, 22 K, 22 H, 22 R, 41, 52, 47

[56] References Cited

U.S. PATENT DOCUMENTS

| 4,104,672 | 8/1978 | DiLorenzo et al. | 357/22 K |
| 4,424,525 | 1/1984 | Mimura | 357/22 A |

FOREIGN PATENT DOCUMENTS

| 53-8572 | 1/1978 | Japan | 357/22 S |
| 57-132368 | 8/1982 | Japan | 357/22 G |
| 58-145166 | 8/1983 | Japan | 357/22 I |
| WO85/02061 | 5/1985 | PCT Int'l Appl. | 357/226 |

Primary Examiner—Rolf Hille
Assistant Examiner—Steven Loke
Attorney, Agent, or Firm—Lowe, Price, LeBlanc & Becker

[57] ABSTRACT

In a field effect transistor (JFET) having a compound semiconducting substrate, a buffer layer having a guard-ring, an active layer, source regions, drain regions, and gate regions, the guard-ring is separated from the active layer whereby gate junction capacitance and gate leakage current are lowered without raising a gate resistance value. As a result, noise characteristics and high frequency characteristics can be improved.

6 Claims, 4 Drawing Sheets

FIELD EFFECT TRANSISTOR WITH ACTIVE LAYER APART FROM GUARD-RING

BACKGROUND OF THE INVENTION

1. Field of the Invention

This invention relates generally to field effect transistors, and particularly to a field effect transistor using a compound semiconducting substrate and a plurality of gates each connected in parallel.

2. Prior Art

As is well known in the prior art, field effect transistors usually include a low-resistance substrate such as a Si substrate. There is an active layer on the Si substrate. In the active layer, a gate region and a guard-ring as an isolation wall are formed, then, a source electrode, a drain electrode, and a gate electrode are arranged on the active layer. In such a structure of the field effect transistors, however, it is not known that a high-resistance substrate such as a GaAs substrate is used instead of the Si substrate.

Generally, junction capacitance between gate and source, gate resistance, and gate leakage current greatly influence the noise of field effect transistors. The present applicant company made a proposal relating to the above-mentioned field effect transistor having the GaAs substrate. In such a field effect transistor devised by the present inventors, since the guard-ring and the active layer are connected to each other, a large leakage current to the active layer results. Therefore, junction capacitance between the guard-ring and the active layer is also large thereby bringing about several disadvantages such as deterioration of high frequency characteristic and noise characteristic.

SUMMARY OF THE INVENTION

The present invention has been developed in order to remove the above-described drawbacks.

It is, therefore, an object of the present invention to provide a new and useful field effect transistor (FET).

It is another object of the invention to provide an FET having an improvement of noise and high frequency characteristics.

It is a further object of the invention to provide an FET in which gate junction capacitance and gate leakage current are lowered without raising a gate resistance value.

In accordance with the present invention there is provided, in a field effect transistor having a plurality of gate, source and drain regions, and gate, source and drain electrodes respectively connected to the gate, source and drain regions, an improvement comprising: a compound semiconducting substrate; a buffer layer provided on the compound semiconducting substrate; an active layer provided on the buffer layer such that the buffer layer is partially covered; a plurality of gate regions embedded in both the buffer layer and the active layer; and a guard-ring connected to the gate regions, the guard-ring being embedded in the buffer layer to be apart from the active layer. Preferably, the guard-ring surrounds the active layer.

In the improved transistor structure the active layer may be positioned higher than the guard-ring when a cross-section of the field effect transistor is viewed from a perspective wherein the compound semiconducting substrate is placed at a bottom portion of the cross-section. Moreover, the gate regions may be connected in parallel by the guard-ring.

In accordance with the present invention there is also provided an improved field effect transistor comprising: a compound semiconducting substrate; a buffer layer provided on the compound semiconducting substrate and an active layer provided on the buffer layer such that the buffer layer is partially covered. Additionally, a plurality of gate regions are embedded in both the buffer layer and the active layer and a guard-ring is connected to the gate regions, the guard-ring being embedded in the buffer layer and apart from the active layer, wherein the guard-ring surrounds the active layer.

In accordance with another aspect of the present invention there is further provided as improved PN junction field effect transistor comprising: a compound semiconducting substrate; a semi-insulating material buffer layer provided on the compound semiconducting substrate and an n-type active layer provided on the buffer layer such that the buffer layer is partially covered. Additionally, a plurality of p-type gate regions are embedded in both the buffer layer and the active layer. A p-type guard-ring is connected to the gate regions for reducing gate junction capacitance and gate leakage current and for electrically isolating the n-type active region, thereby preventing flow of electric current on a surface of the buffer layer and leakage of electric current from the field effect transistor. The guard-ring is embedded in the buffer layer and is apart from the active layer. In this structure the semi-insulating material buffer layer is interposed between the p-type guard-ring and the n-type active layer to form a PIN junction therewith. Moreover, the p-type guard-ring surrounds the n-type active layer, thereby preventing leakage current from flowing near a surface of the substrate and preventing leakage of electric current within the field effect transistor.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Prior to describing the preferred embodiments of the present invention, the above-mentioned field effect transistors having high-resistance substrates such as a GaAs substrate will be described for a better understanding of the present invention.

Figure 7:
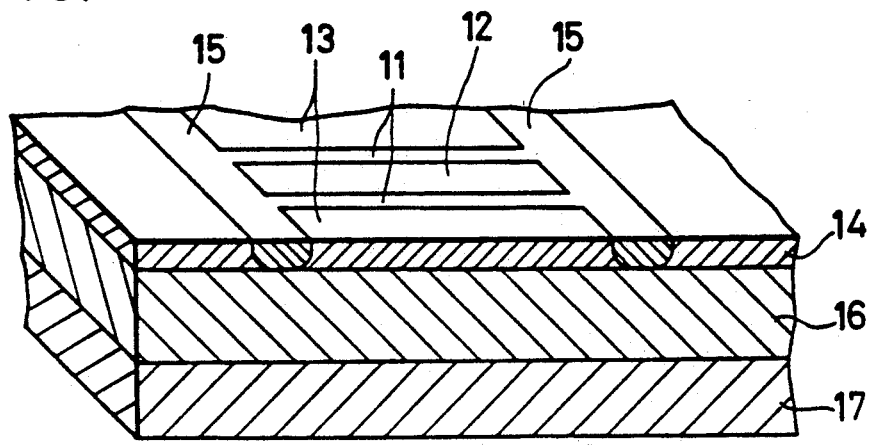
FIG. 7 shows a main part of a GaAs JFET according to an applicants' earlier invention.

As one example of the above-mentioned field effect transistor, a junction field effect transistor (JFET) devised by the present inventors prior to the present invention is shown in FIG. 7. The JFET generally comprises a compound semiconducting substrate 17 made of semi-insulating GaAs, a buffer layer 16, an N-type active layer 14, a guard-ring 15 as a P-type isolation wall, and P-type gate regions 11. The gate regions 11 are connected in parallel to the guard-ring 15. Source regions 13 and drain regions 12 are defined by the gate regions 11 and the guard-ring 15. In FIG. 7, a source electrode, a drain electrode, and a gate electrode are not illustrated for simplicity.

In such a structure of the JFET, a high-concentration P-type impurity is diffused in the guard-ring 15 to lower the resistance value of the gate regions 11. Therefore, the active layer 14 and the guard-ring 15 are connected to each other as a P+-N junction. Junction capacitance caused by the P+-N junction is added to gate junction capacitance thereby bringing about disadvantages such as deterioration of high frequency characteristics and deterioration of noise characteristics. In addition, the proof voltage value between the guard-ring 15 and the active layer 14 is equal to the proof voltage value between one of the gate region 11 and the active layer 14 by in unit area thereof. Therefore, the guard-ring 15 also causes leakage current to the active layer 14 thereby bringing about deterioration of noise characteristics. It is to be noted that the above-mentioned JFET invented prior to the present invention is referred to as applicant's earlier invention throughout the specification.

Figure 1:
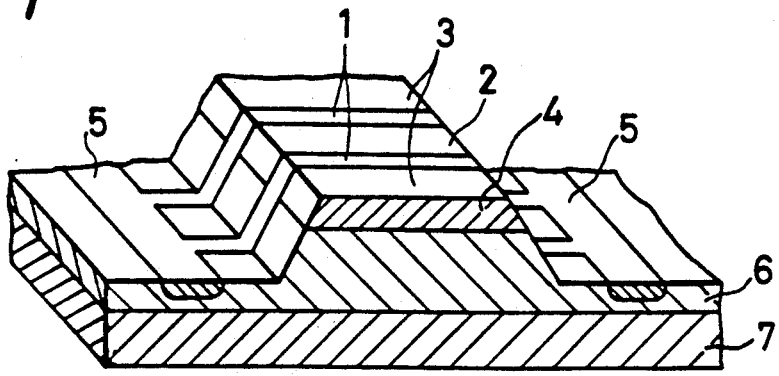
FIG. 1 shows a main part of a first embodiment of GaAs JFETs according to the present invention.
Figure 2:
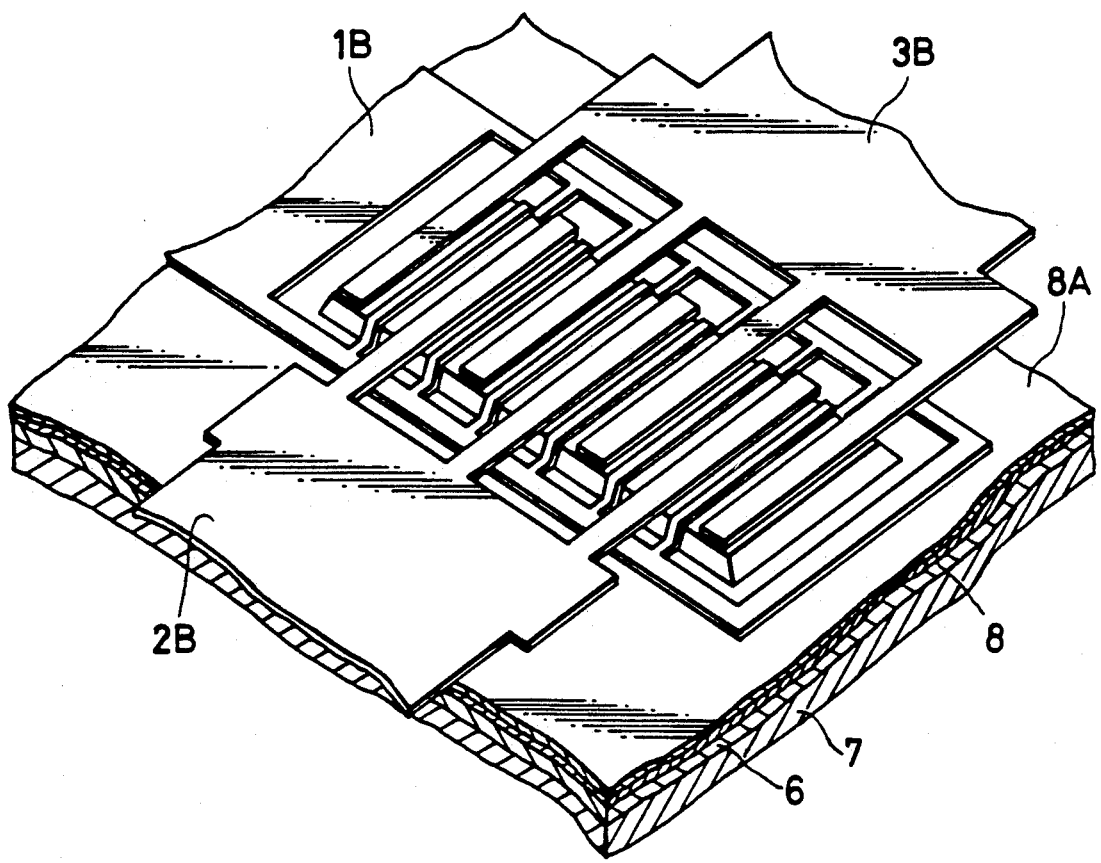
FIG. 2 shows a partial perspective view of the first embodiment.

Referring now to FIG. 1, there is shown a main part of a first embodiment of JFETs according to the present invention. The JFET of the present invention generally comprises a compound semiconducting substrate 7 made of semi-insulating GaAs, a buffer layer 6, an N-type active layer 4, a guard-ring 5 as a P-type isolation wall, and P-type gate regions 1. The gate regions 1 are connected in parallel with the guard-ring 5. Source regions 3 and drain regions 2 are defined by the gate regions 1 and the guard-ring 5. In FIG. 1, any electrode and any masking layer are not illustrated for simplicity. FIG. 2 shows a partial perspective view of the first embodiment. Actually, a source electrode 3B, a drain electrode 2B, and a gate electrode 1B are respectively provided on the source regions 3, the drain regions 2, and the gate regions 1 as shown in FIG. 2.

Turning back to FIG. 1, since the N-type active layer 4 is separated from the P-type guard-ring 5 which is connected in parallel with the gate regions 1, the guard-ring 5 and the active layer 4 are formed as a P-i-N junction having an interposing semi-insulating material such as the buffer layer 6. As a result, the gate junction capacitance of this JFET is smaller than that of the JFET shown in FIG. 7 according to the applicant's earlier invention, thereby also decreasing gate leakage current than the same. In addition, the proof voltage in the present JFET is also higher than that of applicants' earlier invention. Furthermore, since the influence of the guard-ring junction capacitance is negligible, such a guard-ring can be made large. Therefore, gate resistance can also be decreased.

The merits of the present JFET are verified by an experiment according to the present inventors. In one example of the present JFET there was provided a structure having 8 gates under conditions where: a gate length is approximately $1\mu m$; a gate width is approximately $50\mu m$; a carrier concentration in an N-type active layer is approximately $1.5 \times 10^{17}/cm^3$; a carrier concentration in a P-type guard-ring is approximately $1 \times 10^{20}/cm^3$. In such a structure the value of gate junction capacitance of the JFET is lower by approximately 2.0-3.0 pF from that of the JFET according to the applicant's earlier invention.

As will be seen from the above description, the GaAs JFET according to the present invention has great advantages in that the guard-ring is apart from the active layer.

Figure 3A:
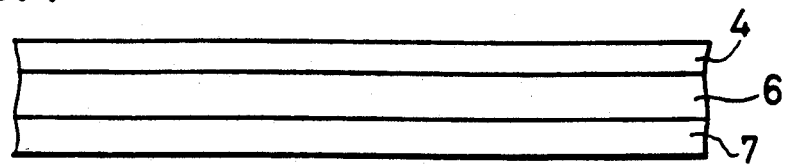
FIGS. 3A-3H show a basic process of the GaAs JFET using a GaAs epitaxial substrate according to the present invention.
Figure 3B:
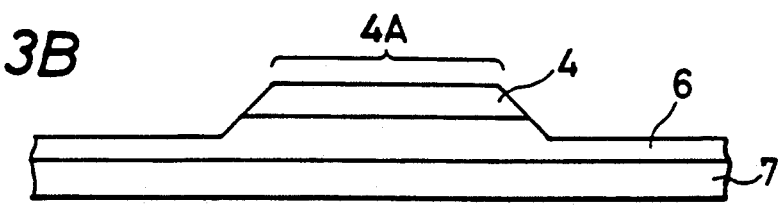
Figure 3C:
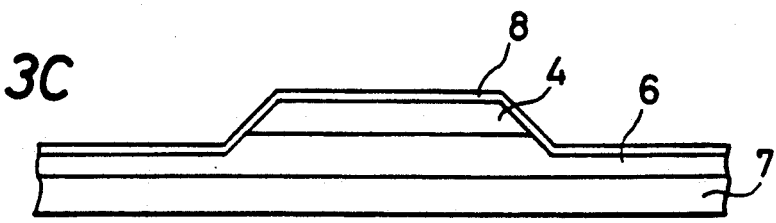

Now the manufacturing process of the present JFET having the above-mentioned structure will be described. FIGS. 3A-3H show a basic process of forming the GaAs JFET using a GaAs epitaxial substrate. The GaAs epitaxial substrate having a thickness of approximately $400\mu m$ generally comprises a semi-insulating GaAs substrate 7, a buffer layer 6 having a thickness of approximately $3-4\mu m$, and an N-type epitaxial layer as an active layer 4 having a thickness of approximately $0.4\mu m$ as shown in FIG. 3A. At first, the part of the active layer 4 which is not to be formed as a channel region 4A is etched away to expose the buffer layer 6 as shown in FIG. 3B. As a result, the buffer layer 6 is partially covered by the active layer 4. At this time, the depth of etching is approximately $1\mu m$. Then a masking layer 8 such as a $Si_3N_4$ layer is provided on the etched GaAs epitaxial substrate as shown in FIG. 3C.

Figure 3D:
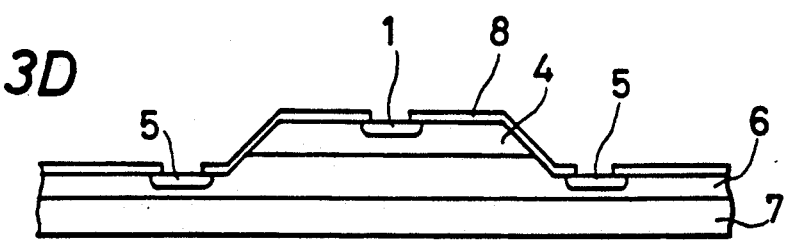
Figure 3E:
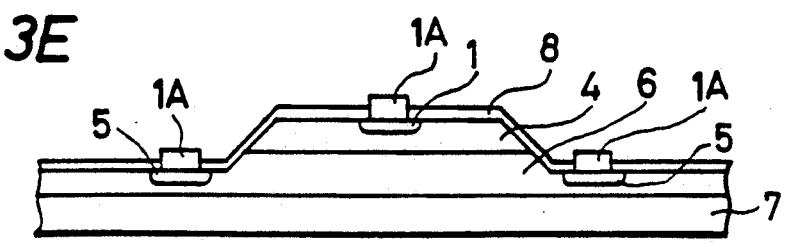

Secondly, the portions of the masking layer 8 which are to be formed on a plurality of gate regions 1 and a guard-ring portion 5 are etched away, and then P-type layers are formed into the active layer 4 and the buffer layer 6 by a thermal diffusion process as shown in FIG. 3D. This diffusion process is performed by thermal-diffusing Zn, for example. At this time, the depth of the formed P-type layer is approximately $0.3\mu m$. It is to be noted that the guard-ring 5 is formed into the buffer layer 6 apart from the channel region 4A of the active layer 4. In this embodiment, the active layer 4 is surrounded by the guard-ring 5. Besides, in a preferred embodiment, since the active layer 4 is formed by the above-mentioned etching process, the active layer 4 is higher positioned than the guard-ring 5 when the cross-section of the FET is viewed where the GaAs substrate 7 is placed at the bottom. After the diffusion process, a gate electrode pad 1A is provided on the gate regions 1 and the guard-ring portion 5 as shown in FIG. 3E. This gate electrode pad 1A is made of AuBe, for example.

Figure 3F:
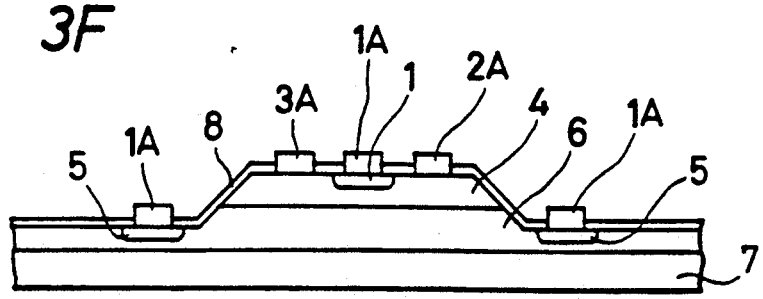
Figure 3G:
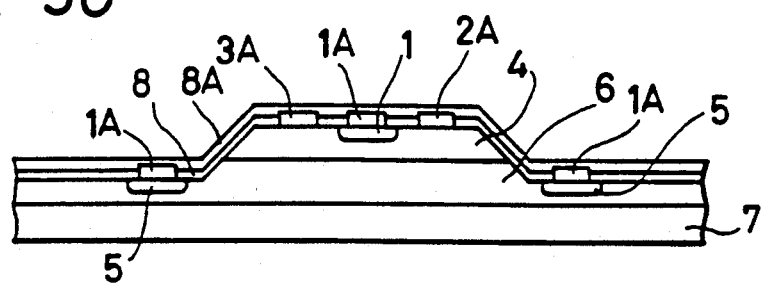
Figure 3H:
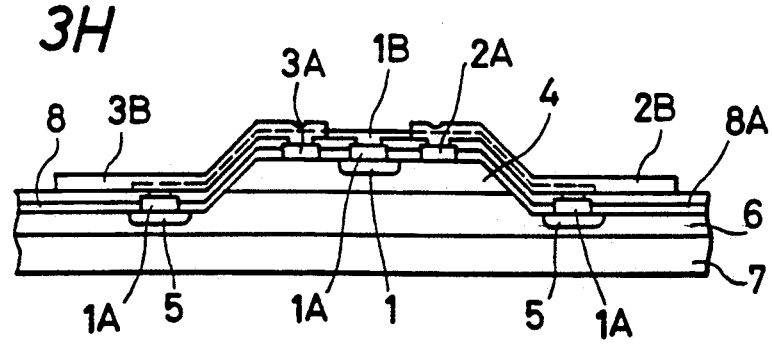

Next, a source electrode pad 3A and a drain electrode pad 2A are respectively provided on the source regions 3 and the drain regions 2 which are defined by the gate regions 1 as shown in FIG. 3F. The source electrode pad 3A and the drain electrode pad 2A are made of AuGe/Ni/Au, for example. After the source, drain, and gate electrode pads are provided on the epitaxial substrate, an insulating layer 8A such as a $Si_3N_4$ layer is also formed as shown in FIG. 3G. Finally, the source electrode 3B, the drain electrode 2B, and the gate electrode 1B are respectively formed on the responding source, drain, and gate electrode pads as shown in FIG. 3H corresponding to FIG. 2.

Figure 4:
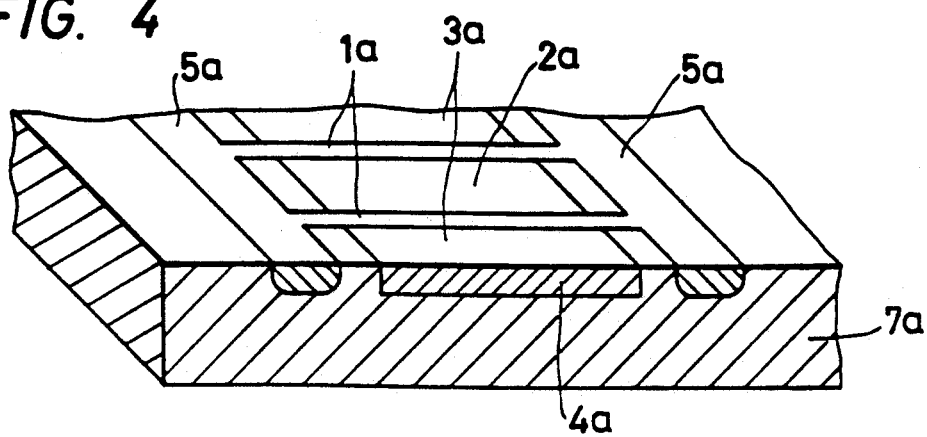
FIG. 4 shows a main part of a GaAs JFET according to a second embodiment of the present invention.

Now, another embodiments of the present invention will be described hereinbelow. Although a thermal diffusion method is performed in the manufacturing process of the first embodiment, an ion-implantation technique may be used instead of the thermal diffusion method. FIG. 4 shows the main part of a GaAs JFET according to a second embodiment according to the present invention. This GaAs JFET comprises a GaAs substrate 7a, an active layer 4a, a guard-ring 5a surrounds the active layer 4a, gate regions 1a, drain regions 2a, and source regions 3a. Although an N-type active layer 4a is not formed as a convex projection and, further, no buffer layer is provided among the active layers, the guard-ring 5a and the GaAs substrate 7a, this structure of the second embodiment is regarded as the present idea in the separation of the guard-ring 5a and the active layer 4a. In this case, the N-type active layer 4a is formed by ion-implanting Si, and P-type region, i.e. gate regions 1a and a guard-ring 5a is formed by either the thermal diffusion method or the ion-implantation technique.

Figure 5:
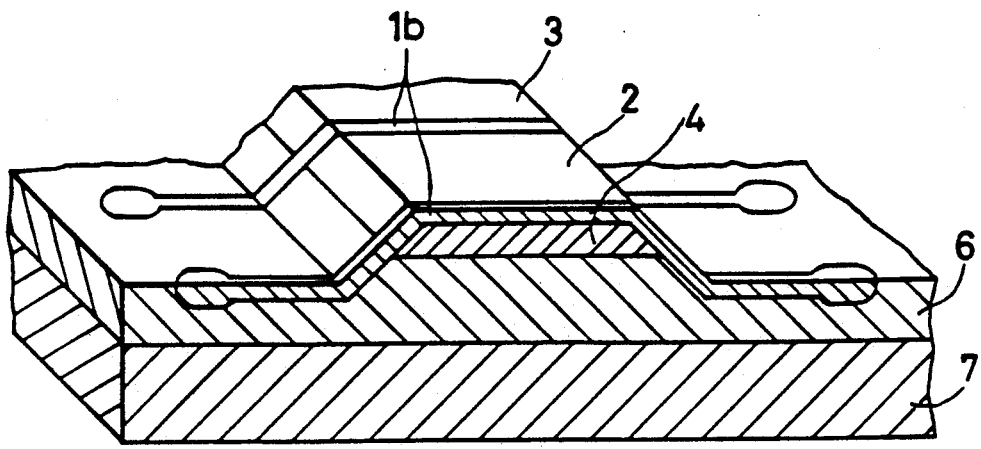
FIG. 5 shows a main part of a GaAs JFET according to a third embodiment of the present invention.
Figure 6:
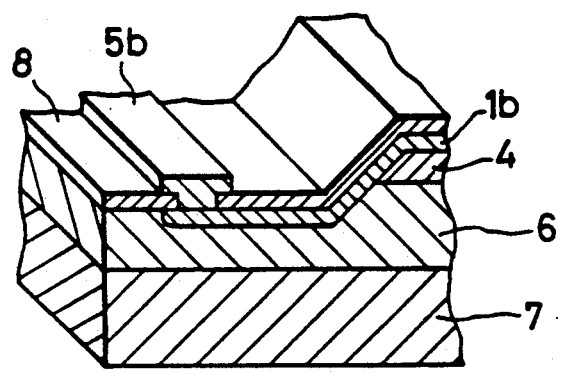
FIG. 6 is a diagram for showing the connection of gates in FIG. 5.

Turning to FIG. 1, assuming that the buffer layer 6 has a high resistance value, it is regarded that the guard-ring 5 operates as only the connecting member for the gates 1. FIG. 5 shows the main part of a GaAs FET according to a third embodiment of the present invention. In FIG. 5, gate regions 1b are separated from each other. The connection for the gate regions 1b is performed in parallel by a connecting member 5b such as metal electrodes on buffer layer 6 as shown in FIG. 6. In this embodiment, the connecting member 5b surrounds the active layer 4, and the active layer 4 is apart from the connecting member 5b. It is to be noted that the gate junction capacitance in this embodiment is lower than that in the first embodiment. Therefore, more desirable noise characteristics and high frequency characteristics can be obtained.

The above-described embodiments are just examples of the present invention, and therefore, it will be apparent for those skilled in the art that many modifications and variations may be made without departing from the scope of the present invention.

What is claimed is:

1. In a field effect transistor having a plurality of gate, source and drain region, and gate, source and drain electrodes respectively connected to the gate, source and drain regions, the improvement comprising:
   (a) a compound semiconducting substrate;
   (b) a buffer layer provided on said compound semiconducting substrate;
   (c) an active layer provided on said buffer layer such that said buffer layer is partially covered;
   (d) a plurality of gate regions embedded in both said buffer layer and said active layer; and
   (e) a guard-ring connected to said gate regions, said guard-ring being embedded in said buffer layer and apart from said active layer.

2. An improved field effect transistor as claimed in claim 1, wherein said active layer is positioned higher than said guard-ring when a cross-section of said field effect transistor is viewed from a perspective wherein said compound semiconducting substrate is placed at a bottom portion of said cross-section.

3. A field effect transistor as claimed in claim 1, wherein said gate regions are connected in parallel by said guard-ring.

4. In a field effect transistor having a plurality of gate, source and drain regions, and gate, source and drain electrodes respectively connected to the gate, source and drain regions, the improvement comprising:
   (a) a compound semiconducting substrate;
   (b) a buffer layer provided on said compound semiconducting substrate;
   (c) an active layer provided on said buffer layer such that said buffer layer is partially covered;
   (d) a plurality of gate regions embedded in both said buffer layer and said active layer; and
   (e) a guard-ring connected to said gate regions, said guard-ring being embedded in said buffer layer and apart from said active layer,
   wherein said guard-ring surrounds said active layer.

5. A field effect transistor as claimed in claim 4, wherein said gate regions are connected in parallel by said guard-ring.

6. In a PN junction field effect transistor having a plurality of gate, source and drain regions, and gate, source and drain electrodes respectively connected to the gate, source and drain regions, the improvement comprising:
   (a) a compound semiconducting substrate;
   (b) a semi-insulating material buffer layer provided on said compound semiconducting substrate;
   (c) an n-type active layer provided on said buffer layer such that said buffer layer is partially covered;
   (d) a plurality of p-type gate regions embedded in both said buffer layer and said active layer; and
   (e) a p-type guard-ring means connected to said gate regions for reducing gate junction capacitance and gate leakage current and for electrically isolating said n-type active region, thereby preventing flow of electric current on a surface of said buffer layer and leakage of electric current from said field effect transistor,
   (f) said guard-ring means being embedded in said buffer layer and apart from said active layer; wherein
   (g) said semi-insulating material buffer layer is interposed between said p-type guard-ring means and said n-type active layer to form a PIN junction therewith; and
   (h) said p-type guard-ring means surrounds said n-type active layer, thereby preventing leakage current from flowing near a surface of said substrate and leakage of electric current within said field effect transistor.

* * * * *